US009389293B2

(12) United States Patent
Stemmer

(10) Patent No.: US 9,389,293 B2
(45) Date of Patent: Jul. 12, 2016

(54) METHOD AND MAGNETIC RESONANCE TOMOGRAPHY SYSTEM TO GENERATE MAGNETIC RESONANCE IMAGE DATA OF AN EXAMINATION SUBJECT

(75) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1130 days.

(21) Appl. No.: 13/416,289

(22) Filed: Mar. 9, 2012

(65) Prior Publication Data

US 2012/0229136 A1 Sep. 13, 2012

(30) Foreign Application Priority Data

Mar. 11, 2011 (DE) .......................... 10 2011 005 445

(51) Int. Cl.
G01R 33/44 (2006.01)
G01R 33/563 (2006.01)
G01R 33/565 (2006.01)
G01R 33/24 (2006.01)

(52) U.S. Cl.
CPC ...... *G01R 33/56383* (2013.01); *G01R 33/5659* (2013.01); *G01R 33/246* (2013.01)

(58) Field of Classification Search
CPC ........... G01R 33/246; G01R 33/56383; G01R 33/5659
USPC ........... 324/300–322; 600/407–422; 382/131, 382/132
See application file for complete search history.

(56) References Cited

U.S. PATENT DOCUMENTS

| 5,600,244 | A | 2/1997 | Jensen et al. |
| 7,511,489 | B2 | 3/2009 | Fautz et al. |
| 2006/0106299 | A1 | 5/2006 | Uchizono et al. |
| 2006/0261809 | A1 | 11/2006 | Fuderer et al. |
| 2006/0261810 | A1 | 11/2006 | Fautz et al. |
| 2007/0145977 | A1* | 6/2007 | Keupp ............... G01R 33/5611 324/318 |
| 2008/0054899 | A1 | 3/2008 | Aksoy et al. |
| 2009/0003674 | A1 | 1/2009 | Keupp et al. |
| 2009/0219020 | A1 | 9/2009 | Kurokawa et al. |
| 2009/0309594 | A1* | 12/2009 | Feiweier et al. ............... 324/309 |
| 2010/0166284 | A1* | 7/2010 | Smith et al. ................... 382/131 |

(Continued)

FOREIGN PATENT DOCUMENTS

| CN | 101166462 A | 4/2008 |
| WO | 2007/117853 A1 | 10/2007 |
| WO | 2010/109349 A1 | 9/2010 |

OTHER PUBLICATIONS

Hu et al., "Application of SENSE to Continuously Moving Table MRI: Demonstration of Feasibility," Proc. Intl. Soc. Mag. Reson. Med., vol. 11 (2004), p. 325.

(Continued)

*Primary Examiner* — Melissa Koval
*Assistant Examiner* — Rishi Patel
(74) *Attorney, Agent, or Firm* — Schiff Hardin LLP

(57) ABSTRACT

A method and magnetic resonance tomography system to generate magnetic resonance image data of an examination subject, raw imaging data are acquired from multiple slices of a predetermined volume region of the examination subject using local coils during a table feed in the magnetic resonance scanner. Image data of the slices are reconstructed on the basis of the raw imaging data. A normalization of the image data is subsequently implemented on the basis of measured coil sensitivity data of the local coils that are used.

16 Claims, 5 Drawing Sheets

(56) References Cited

U.S. PATENT DOCUMENTS

2010/0289493 A1 11/2010 Stemmer
2011/0148410 A1* 6/2011 Zaitsev .............. G01R 33/5611
324/309

OTHER PUBLICATIONS

Keupp et al., "Continuous Moving Table SENSE Imaging," Proc. Intl. Soc. Mag. Reson. Med., vol. 11 (2004), p. 324.
Kannengießer, S.A.R., "Parallel Imaging for Continuously Moving Table MRI Using Moving RF Coils and In-place Sensitivity Calibration," Second International Workshop on Parallel MRI, Latsis Symposium 2004, University and ETH Zürich.
Peter Börnert, PhD et al., "Principles of Whole-Body Continuously-Moving-Table MRI," Journal of Magnetic Resonance Imaging, vol. 28 (2008), pp. 1-12.
Fautz et al., "Sliding Multislice (SMS): A New Technique for Minimum FOV Usage in Axial Continuously Moving-Table Acquisitions," Magnetic Resonance in Medicine, vol. 55 (2006), pp. 363-370.
Walsh et al., "Adaptive Reconstruction of Phased Array MR Imagery," Magnetic Resonance in Medicine, vol. 43 (2000), pp. 682-690.
Roemer et al., "The NMR Phased Array," Magnetic Resonance in Medicine, vol. 16 (1990), pp. 192-225.
Griswold et al., "Autocalibrated coil sensitivity estimation for parallel imaging," NMR in Biomedicine, vol. 19 (2006), pp. 316-324.
Honal et al., "Increasing Efficiency of Parallel Imaging for 2D Multislice Acquisitions," Magnetic Resonance in Medicine, vol. 61 (2009), pp. 1459-1470.

* cited by examiner

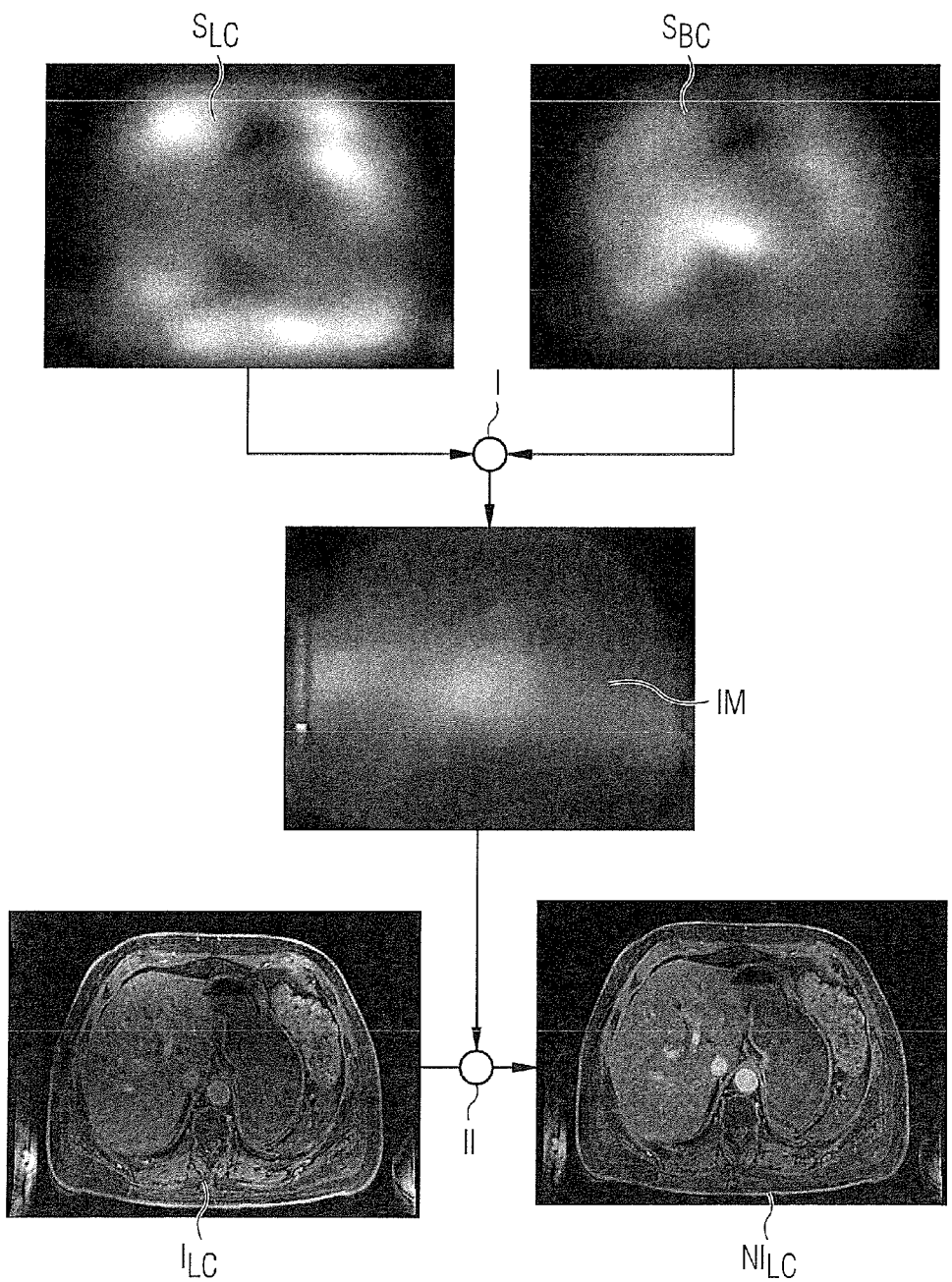

METHOD AND MAGNETIC RESONANCE TOMOGRAPHY SYSTEM TO GENERATE MAGNETIC RESONANCE IMAGE DATA OF AN EXAMINATION SUBJECT

BACKGROUND OF THE INVENTION

1. Field of the Invention

The invention concerns a method to generate magnetic resonance image data of an examination subject by means of a magnetic resonance tomography system, in which method raw imaging data composed of multiple slices of a predetermined volume region of the examination subject are acquired using local coils during a table feed into the magnetic resonance scanner during a magnetic resonance measurement (data acquisition), and based on this raw imaging data, image data of the slices are then reconstructed. Moreover, the invention concerns a magnetic resonance tomography system with a magnetic resonance scanner and a control device designed to control the magnetic resonance tomography system for a magnetic resonance measurement so that raw imaging data composed of multiple slices of a predetermined volume region of an examination subject are acquired using local coils during a table feed into the magnetic resonance scanner, and a reconstruction unit designed to reconstruct image data of the slices on the basis of the raw imaging data.

2. Description of the Prior Art

In a magnetic resonance system, the body to be examined is typically placed in a basic field magnet system so as to expose the subject to a relatively high basic magnetic field, known as the "$B_0$ field," of 1.5, 3 or 7 Tesla, for example. With a gradient system, a magnetic field gradient is additionally applied. Radio-frequency excitation signals (RF pulses)—known as the "$B_1$ field"—are then emitted via a radio-frequency transmission system by means of suitable antenna devices, which cause the nuclear spins of specific atoms excited to resonance by this radio-frequency field to be tilted with spatial resolution by a defined flip angle relative to the magnetic field lines of the basic magnetic field. Upon relaxation of the nuclear spins, radio-frequency signals (known as magnetic resonance signals) are radiated that are received by suitable reception antennas, and then processed further. The data acquisition takes place line by line in spatial frequency space, known as "k-space". Based on these raw data, a reconstruction of the image data which depict an image of the inside of the examination subject in "real" positional space then takes place by a Fourier transformation. The center of k-space contains the lower spatial frequencies (and thus the essential contrast information with regard to positional space) but no information about spatial details, meaning that an image with low resolution and high contrast can be generated from these central data. The further outlying regions of k-space contain the high spatial frequencies that are responsible for edges in the image data (tissue boundaries, for example) being well visible.

Early MR systems use the same coil as a transmission and reception coil, namely a coil known as a "volume coil" or "body coil" permanently installed in the scanner. A typical design of a volume coil is a cage antenna (birdcage antenna) that has multiple transmission rods arranged parallel to the longitudinal axis, distributed around a patient space of the scanner in which a patient is located for the examination. At the ends, the antenna rods are connected capacitively with one another in a ring.

Currently the volume coil is normally used only as a transmission coil during the radio-frequency radiation in order to generate an optimally homogeneous $B_1$ field perpendicular to the direction of the basic magnetic field. The signal reception usually takes place with multiple dedicated reception coils (typically designated as "local coils") that are placed optimally close to the organ of the patient that is to be examined. The signals of the different local coils are initially processed individually (respectively in separate acquisition channels) and are subsequently combined into a common image. The reason for the use of the local coils is a significantly higher signal-to-noise ratio (SNR)—at least in portions of the image—than given the use of the volume coil as an acquisition coil. Furthermore, with the use of parallel reconstruction techniques, multiple acquisition coils with different spatial sensitivity enable phase coding steps to be partially replaced, and therefore enable acquisition times to be significantly reduced (in addition to other advantages).

If the combination of the individual images of the individual acquisition channels takes place without exactly weighting the individual acquisition channels corresponding to the sensitivity of the associated acquisition coil (which is, for example, the case given the frequently used "sum of squares" method), the reconstructed image thus shows intensity variations whose cause is not anatomical. This can significantly hinder the assessment of the images by the radiologist, and increases the risk of false positive findings and also hinders the evaluation of the images with computer-assisted methods.

If the magnetic resonance measurement (data acquisition) takes place with a stationary table, the intensity variations as a result of the sensitivity of the local coils can be at least partially corrected with known methods. In newer apparatuses and methods, the table with the examination subject is moving during the magnetic resonance measurement, and most often the local coils are moving as well. The sensitivity of the local coil therefore changes during the measurement, and the known methods for correction of the unwanted intensity variations can no longer be used. Movement of the table during the measurement has the advantage that the field of view (FOV) can be extended in the direction of the table feed. Additionally, the measurement region within the magnetic resonance scanner can simultaneously be limited to a region in which a particularly homogeneous $B_0$ field is provided, the gradient coils have a defined linearity and an optimally homogeneous $B_1$ field emitted by the volume coil is also present.

SUMMARY OF THE INVENTION

An object of the present invention is to provide a method as well as a suitable magnetic resonance tomography system that avoid the problem described above, even in data acquisition procedures in which the table is moved during the magnetic resonance measurement.

As described above, in the method according to the invention raw imaging data are acquired from multiple slices of a predetermined volume region of the examination subject using local coils during a magnetic resonance measurement given simultaneous table feed. The table feed can take place continuously with a uniform speed, but also with varying speed, and it is likewise possible for the table to stop intermittently and then is driven on after a defined pause. The acquisition of the magnetic resonance data can take place during a table movement, but also in standstill pauses. The local coils can be stationary coils arranged in the scanner or coils moving along with the table. Image data of the slices are reconstructed in a typical manner based on these raw image data. According to the invention, a normalization of the image data then takes place on the basis of measured coil sensitivity data of the local coils used to acquire the raw imaging data.

As used herein a "normalization" means an equalization of intensity variations in the image data whose causes lie in the different sensitivities of the reception coils and are not due to anatomy. For example, for such a normalization, each pixel of the anatomical image data—i.e. of the image data reconstructed from the raw imaging data—can be weighted with an inverse sensitivity in order to correct the intensity variations caused by the different sensitivities of the local coils.

As mentioned above, in addition to the magnetic resonance scanner a magnetic resonance tomography system according to the invention requires a corresponding control device which is designed so that the magnetic resonance scanner is suitably controlled in order to acquire raw imaging data from multiple slices of the predetermined volume region of the examination subject using local coils during a table feed, and a reconstruction unit that is accordingly designed to reconstruct the image data of the slices based on these raw imaging data. According to the invention, the magnetic resonance tomography system also requires a normalization unit which is designed in order to implement a normalization of the image data on the basis of measured coil sensitivity data of the local coils that are used. This normalization unit can be part of the reconstruction device and/or part of the control device of the magnetic resonance tomography system, for example. However, it can also be realized on a separate computer of the magnetic resonance tomography system (a terminal connected to this etc., for example), possibly together with the reconstruction unit. In particular, the reconstruction unit and/or the normalization unit can also be fashioned in the form of software components.

The invention thus also encompasses a non-transitory, computer-readable data storage medium encoded with programming instructions, that can be loaded directly into a memory of a computer of a magnetic resonance tomography apparatus, the programming instructions causing all steps of the method according to the invention to be implemented when the program is executed in the computer. As mentioned, the computer can be a part of the controller of the magnetic resonance tomography apparatus or a separate computer that can access the raw data in order to reconstruct and simultaneously normalize the image data from these, or that can access finished image data in order to then subsequently normalize the data. The computer can also be designed as a system composed of multiple internetworked computers or processors. A realization in software has the advantage that already existing magnetic resonance tomography systems realized with suitable programmable processors and memories can also be modified in a suitable manner by implementation of the program in order to operate in the manner according to the invention.

In principle, the coil sensitivity data can be measured in a separate measurement and be stored in a memory to which the normalization unit has access in order to obtain from this the coil sensitivity data for the coils. However, to obtain the coil sensitivity, data within the scope of sensitivity measurements, raw local coil sensitivity data for low-resolution local coil image data, and raw volume coil sensitivity data for low-resolution volume coil image data are additionally acquired during the magnetic resonance measurement to acquire the raw imaging data, and the coil sensitivity data are then determined based on the additional data. In one embodiment, a low-resolution whole body coil image and a low-resolution local coil image are measured separately (particularly preferable), and the calculation of the local coil sensitivity takes place from this. A simple determination of the coil sensitivity from the low-resolution local coil image data and the low-resonance volume coil image data is possible in an embodiment wherein the local coil image data are divided pixel-by-pixel by the volume coil image data. In this procedure it is assumed that the spatial sensitivity of the volume coil can be assumed as constant in a good approximation.

Since this quotient assumes no reasonable values for background pixels that essentially contain only noise, such pixels should be excluded in the normalization, or the corresponding data of the coil sensitivities should be smoothed either before the division or retroactively after the division in a background correction. Typical background correction methods can be used for this as are known to those skilled in the art from other fields, for example the fitting of a smoothing function either before the division to the low-resolution local coil image data and the low resolution volume coil image data, or after the division to the coil sensitivities.

The acquisition of the raw local coil sensitivity data for low-resolution local coil image data and the acquisition of the raw volume coil sensitivity data for the low-resolution volume coil image data for a slice preferably by k-space lines for the low-resolution local coil image data and k-space lines for the low-resolution volume coil image data being read out in alternation. This means that the same k-space lines are respectively read out at least twice in succession, namely once by the local coil and once by the volume coil. This method minimizes differences in corresponding k-space lines as a result of the travel and/or patient movement and/or physiological movement, such that the change in the received signal can be ascribed in good approximation to the different illumination of the reception coils. Otherwise, change in the received signal whose cause is the cited movements would incorrectly be interpreted as being due to sensitivity, and thus the sensitivity measurements could be adulterated and could ultimately be responsible for additional errors being generated in the image data by the normalization. This method is independent of the sequence with which the coil sensitivities are measured. The order of the measurements is not important. It is thus just as advantageous to acquire the k-space line first with the volume coil and immediately after this with the local coil.

For example, it would thus be possible to measure the coil sensitivities in the examination region in the examination region within the scope of what is known as a pre-scan. In such a pre-scan, the two low-resolution data sets—one with the local coils used during the subsequent imaging method and one with the volume coil—could be acquired with a fast, proton density-weighted, spoiled 3D gradient echo sequence, for example.

The volume of such a pre-scan measurement includes the volume of the subsequent imaging sequence. However, such a method is primarily useful when the raw imaging data are subsequently acquired with a classical method with stationary table. If instead, measurement occurs while a table moves as in the method according to the invention, this method cannot be simply applied because a portion of the volume to be acquired via the pre-scan lies outside of the measurement volume of the magnetic resonance scanner, and because different sets of local coils are switched between during the travel. Therefore, in preferred variant of the method according to the invention, the sensitivity measurements that ultimately serve to determine the sensitivities of the coils are implemented between the acquisition of the raw imaging data (also referred to in the following as "imaging measurement")—which primarily serve for the anatomical imaging of the image data required for a later diagnostic, for example—for the different slices.

The method used to measure the coil sensitivity data between the measurements of the raw imaging data thereby depends on, among other things, the sequence technique of the imaging sequence, since a negative influencing of the imaging sequence by the measurement of the coil sensitivity data and, conversely, an adulteration of the measured coil sensitivity data by the imaging sequence should be avoided to the extent possible, and at the same time the additional time that is required for the measurement of the coil sensitivity data should be minimized.

The most important techniques for acquisition of raw imaging data given simultaneous table feed can be roughly divided into 2D axial measurements with table feed perpendicular to the image plane, and 3D techniques in which the readout direction is oriented parallel to the direction of the table feed. In the 2D axial measurement, relatively thin 2D slices are respectively acquired and a specific, three-dimensional volume is densely acquired with via a slice stack formed of these relatively thin 2D slices. The slice selection in the z-direction traveling in the table feed direction is implemented by a suitable, simultaneous switching of gradient pulses and radio-frequency pulse. The spatial resolution in the x-direction and y-direction, perpendicular to the z-direction, takes place with the use of the readout gradient, which for the most part is switched from right to left relative to the patient, and a phase coding gradient which then travels perpendicular to the table in the anterior/posterior direction relative to the patient. Within the scope of the present invention, the readout of the raw imaging data preferably takes place perpendicularly to a table feed direction, meaning that thin 2D slices are acquired as previously described.

The optimal implementation of a method according to the invention to implement sensitivity measurements in 2D axial measurements with table feed perpendicularly to the image plane depends on the employed sequence type of the imaging measurement that is used. Differentiation is made between three different principle sequence types.

In the first procedure, the data of a single slice are successively acquired in the center of the magnet while the examination subject is driven through the scanner with constant speed. The data of a first slice are completely acquired before the data acquisition of an additional slice is begun. Sequences with short repetition time are suitable for this, for example.

In a second principle procedure, as in the first procedure the slice data are successively acquired, meaning that the data of a first slice are completely acquired before the data acquisition of a second slice is begun. However, the data of anatomically adjacent slices are not acquired, or at least are preferably not acquired in chronological succession, in order to avoid a crosstalk of the slices. "Crosstalk" of the slices occurs because each selective radio-frequency pulse has an imperfect excitation profile due to its finite duration. Each radio-frequency pulse thus technically unavoidably also affects regions that are located outside of the desired slice. This effect occurs most strongly between immediately adjacent slices. If a neighboring slice is acquired before the distorted magnetization has returned to its steady state (which is approximately the case only after four to five times the $T_1$ time of the tissue), the signal intensity thus drops and therefore the signal-to-noise ratio and the contrast of the image can vary. Sequences of this type are, for example, sequences in which all k-space lines of an image are read out after a single radio-frequency excitation pulse, and sequences with short repetition time in which a selective preparation pulse is used to suppress an unwanted signal component, or to achieve a desired contrast.

In these two basic method modules described above it is suggested that the sensitivity measurements for a specific slice and the imaging measurement of the same slice take place grouped together in time, for example adjacently in pairs.

The sensitivity measurement for a specific slice is preferably implemented before a measurement of raw imaging data of the slice since the sensitivity measurement can take place with a small excitation flip angle (for example with use of a gradient echo sequence), and thus the disruption of the magnetization due to the sensitivity measurement is slight and has largely decayed at the point in time of the following imaging measurement. If the sensitivity measurement is implemented before the imaging measurement, the influence of the two measurements overall is thus smaller.

In a third principle procedure to acquire the raw imaging data, the data acquisition for the different slices proceeds as in conventional magnetic resonance tomography (i.e. with a stationary table) with an interleaved acquisition technique in which data of other slices are acquired between the successive excitation of a slice, and between two excitations of the same slice the excitation location is thus adapted to the table speed so that the same slice in the examination subject is respectively acquired, assuming a rigid examination subject. The method is advantageous for sequences with longer repetition time such as $T_1$-weighted FLASH techniques or multishot turbo spin echo sequences (TSE), in which a repetition time from 70 ms up to multiple seconds is necessary in order to achieve a desired contrast or maintain the signal.

In the last cited procedure, the acquisition of the raw imaging data—i.e. the imaging measurement—thus takes place for a slice in that k-space segments (that each include multiple k-space lines) of this slice are acquired in multiple partial (imaging) measurements. In this method a sensitivity measurement for the respective slice advantageously takes place in turn before acquisition of the first k-space segment. Due to the relatively long time between successive excitations of the same slice, in the third procedure a sensitivity measurement for the respective slice would also advantageously be possible after acquisition of the last segment.

If the acquisition of the raw imaging data for a slice takes place in multiple such partial imaging measurements of the k-space segments at defined measurement positions in a measurement space of the magnetic resonance scanner, a specific measurement position in the measurement space is preferably associated with a sensitivity measurement. In order to ensure in this case that the sensitivity measurement takes place before acquisition of the first k-space segment, this measurement position can be the first measurement position in the measurement space in the table feed direction.

Independent of in the order and/or interleaving with which the sensitivity measurements and the imaging measurements are implemented, in the sensitivity measurements the excitation of the slices preferably takes place with only a small flip angle, preferably <5°. This is sufficient for reconstruction of the low-resolution image data for the sensitivity data determination and ensures that the imaging measurements are affected as little as possible by the sensitivity measurements. Moreover, if a sensitivity measurement is immediately upstream of a measurement of raw imaging data, it is preferable to initially insert a wait of a defined minimum wait time duration or pause time duration before the raw imaging data of the slice previously measured in the sensitivity measurement is ultimately acquired.

In a further preferred variant, the measurement time for the sensitivity measurement is shortened in that raw data to determine sensitivity data for a specific slice are determined directly from the raw imaging data, or at least one k-space segment of the raw imaging data of the appertaining slice. For example, k-space lines of the raw imaging data, preferably from the k-space center, can be directly adopted from which low-resolution local coil images can be generated.

Raw imaging data are normally acquired only with the local coils. Therefore, in this variant the appertaining k-space lines are acquired again with the volume coil to generate low-resolution volume coil image data. For the reasons cited above, here the second measurement of a specific k-space line to acquire volume coil sensitivity data also preferably takes place immediately after the first measurement of the same k-space line to acquire local coil sensitivity data and raw imaging data. The order of the measurements is also not important here. It is thus just as advantageous to acquire the k-space line first with the volume coil and immediately afterward with the local coil.

One possible method to acquire local coil sensitivity data in this way is described by S. A. R. Kannengießer in "Parallel Imaging for Continuously Moving Table MRI Using Moving RF Coils and In-place Sensitivity Calibration", Second International Workshop on Parallel MRI, Latsis Symposium 2004, University and ETH Zürich. Moving coils are thereby used with what is known as "in-place" calibration and the parallel reconstruction technique GRAPPA for imaging. "In-place" calibration means that k-space is not completely undersampled. Rather, the central region of k-space associated with the low spatial frequencies is scanned with sufficient density according to the Nyquist theorem. This central region is then used for coil calibration. For example, low-resolution images from which the coil sensitivities can be approximated in turn can be calculated from the densely scanned k-space region in the undersampled direction. This "in-place" calibration has a range of advantages such as the relative movement insensitivity. However, given the "in-place" calibration described there only data of the local coils are acquired. Although coil sensitivities that are derived solely from data that were acquired with local coils are normally sufficient for a use of the coil sensitivities for the parallel image reconstruction, they are often not sufficient for image normalization. Therefore, within the scope of the described preferred exemplary embodiment of the method according to the invention the central k-space lines are not only sufficiently densely scanned but rather are additionally doubly scanned, namely a second time with the volume coil.

As explained above, the measured coil sensitivity data are used in the manner according to the invention to normalize the image data. However, these coil sensitivity data can also particularly preferably be additionally used for further purposes, in particular preferably within the scope of a parallel image reconstruction method and/or for complex combination of single coil images. Methods of how coil sensitivity data can be used for these purposes are explained in detail below.

BRIEF DESCRIPTION OF THE DRAWINGS

FIG. 5 illustrates a possible method for normalization of image data based on coil sensitivity data measured according to the invention.

DESCRIPTION OF THE PREFERRED EMBODIMENTS

Figure 1:
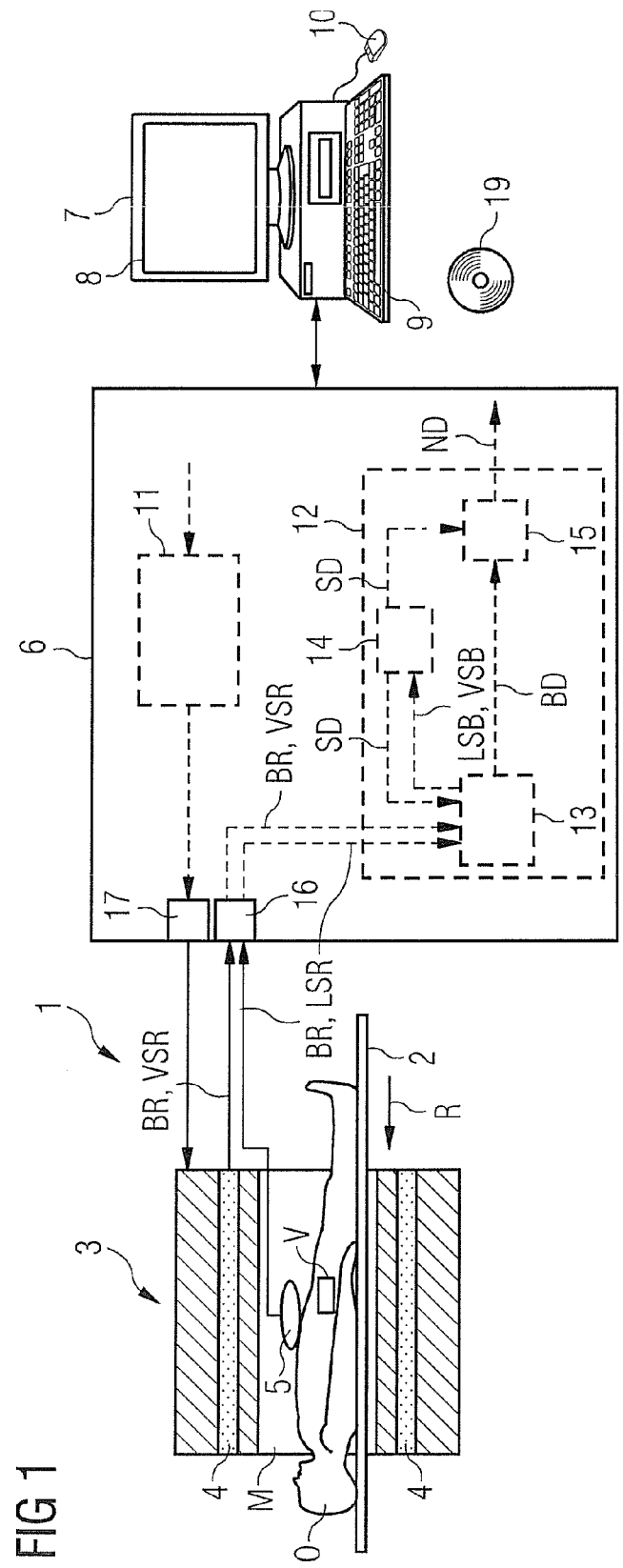
FIG. 1 is a schematic representation of an exemplary embodiment of a magnetic resonance tomography system according to the invention.

An exemplary embodiment of a magnetic resonance tomography system 1 according to the invention is schematically presented in FIG. 1. The magnetic resonance tomography system 1 essentially includes a magnetic resonance scanner (data acquisition unit) 3 with which the basic magnetic field necessary for the magnetic resonance measurement is generated in a measurement space M. A table 2 on which a patient or examination subject O can be positioned is located in the measurement space M (also called a patient tunnel). As is typical, the magnetic resonance scanner 3 has a volume coil 4 as a transmission antenna system. Moreover, multiple gradient coils are located in the scanner 3 in order to respectively apply the desired magnetic field gradients in the three spatial directions. For clarity, however, these components are not shown in FIG. 1.

The magnetic resonance tomography system 1 also has a control device 6 with which the scanner 3 is controlled and magnetic resonance data, here raw imaging data BR, raw volume coil sensitivity data VSR and raw local coil sensitivity data LSR, among other things, are received from the scanner 3. A terminal 7 is connected to the control device 6. The control device 6 includes an activation unit 11 and an evaluation unit 12 for the magnetic resonance data.

During a magnetic resonance measurement, magnetic resonance signals are acquired by local coils 5 (of which only one is shown) positioned on the patient O in the measurement space M, and possibly by the volume coil 4, and after a pre-processing are passed as magnetic resonance data BR, LSR, VSR via a raw data interface 16 to the evaluation unit 12. The scanner 3 and the table 2 are activated by the activation unit 11 via a control data interface 17 such that magnetic resonance signals are acquired from a defined volume region V (the measurement volume V) which is located inside the body of a patient O lying on the table 2.

The evaluation unit 12 includes a reconstruction unit 13, a sensitivity data determination unit 14 and a normalization unit 15. The evaluation unit 12 is realized with all of these components 13, 14, 15, in the form of software on a suitable processor of the control device 6. Image data BD are reconstructed in the reconstruction unit 13 from the raw imaging data BR. This can be implemented with one of the typical methods known to those skilled in the art. Moreover, here low-resolution local coil image data LSB are reconstructed from the raw local coil sensitivity data LSR and low-resolution volume coil image data VSB are reconstructed from the raw volume sensitivity data VSR, the low-resolution image data LSB and VSB then being passed to the sensitivity data determination unit 14. As is explained in more detail below using FIG. 5, from the data LSB and VSB the sensitivity data determination unit 14 calculates coil sensitivity data SD that are passed to the normalization unit 15. At the same time, the normalization unit 15 receives the associated image data BD from the image reconstruction unit 13. The normalization unit 15 then provides for a normalization of the image data BD on the basis of the coil sensitivity data SD and provides these as normalized ND.

The normalized image data ND can be graphically presented on a monitor 8 of the terminal 7, for example. Alternatively, the raw data and/or image data can also be stored in a mass storage (not shown). The coil sensitivity data SD can also be supplied back from the sensitivity data determination unit 14 to the reconstruction unit 13 so that this can additionally use the coil sensitivity data SD, for example within the scope of the reconstruction of image data BD, for example when parallel imaging methods are used.

In addition to the graphical presentation of the image data ND, a volume region V to be measured and additional parameters to implement the method according to the invention can for example be defined by a user with the terminal 7, which includes a keyboard 9 and a mouse 10 in addition to the monitor 8. The control of the magnetic resonance scanner 3 by the control device 6 typically occurs wholly automatically during the magnetic resonance measurement by means of a measurement protocol that the operator has selected in advance from a collection of prepared measurement protocols, and normally has modified so that the measurement that the operator desires is implemented.

The software for the control device 6—in particular for the evaluation 12—can also be loaded into the control device 6 via the terminal 7. This software of the control device 6 can embody the method according to the invention. It is also possible for a method according to the invention to be contained in software that runs at the terminal 7. Independently of the software in which the method according to the invention is contained, the software can be stored on a DVD 19 or on another data medium so that this software can then be read by the terminal 7 from the DVD 19 and be copied either into the control device 6 or into a computer of the terminal 7 itself.

The control data interface 17 and the raw data interface 16 here are respectively represented in a very simplified form only as a block. These interfaces actually are composed of a plurality of individual components. For example, the control data interface 17 has one or more transmission channels with corresponding radio-frequency amplifiers in order to be able to feed RF pulses with the required strength and pulse shape into the volume coil 4, as well as suitable (gradient) interfaces in order to supply the gradient coils with the matching gradient pulses. The raw data interface 16 likewise has a number of acquisition channels for the volume coil 4 and the various local coils 5 (of which only one is shown).

Such a magnetic resonance tomography system 1—in particular the control device 6—can furthermore have a number of additional components, for example interfaces to connect to a network in order to also pass the raw data and/or the reconstructed image data to other stations etc. The magnetic resonance scanner 3 also can be designed differently than is shown here, for example as a scanner open to one side. However, since the basic design of magnetic resonance tomography systems is known to those skilled in the art, depiction of all of these components and variants in FIG. 1 and their explanation in detail is not necessary.

In the following, various preferred methods of how the sensitivity measurements SM can be combined with the imaging measurements within a measurement sequence are explained as examples using FIGS. 2 through 4.

In all methods described in the following the imaging measurements are implemented in the form of axial 2D measurements with a table feed perpendicular to the image plane. This means that the readout direction is perpendicular to the table feed direction R. The coil sensitivity is thereby measured individually for each anatomical slice SL with a fast, proton density-weighted, spoiled 2D gradient echo sequence (with short echo time TE and short repetition time TR).

The pixel count $N_x$ in the readout direction, the pixel count $N_y$ in the phase coding direction, the field of view $FOV_x$ in the readout direction, the field of view $FOV_y$ in the phase coding direction, and thus the Fourier pixel size $d_x = FOV_x/N_x$ in the readout direction and the Fourier pixel size $d_y = FOV_y/N_y$ in the phase coding direction for the sensitivity measurement is taken from the associated imaging measurement (also called "anatomical measurement" in the following) that should be normalized. In k-space $dk_y = 1/(N_y \cdot d_y) = 1/FOV_y$ thus applies for the line spacing and $dk_x = 1/(N_x \cdot d_x) = 1/FOV_x$ applies for the column spacing. However, the resolution in the image plane is significantly lower than in the anatomical measurement. However, this does not entail a limitation since it can be assumed that the coil sensitivities change slowly in space. However, the low resolution has the advantage that only the central region of k-space must be acquired, thus that the duration of the readout interval can be shortened and the number of measured lines can be reduced relative to the high-resolution anatomical measurement. These two measurements together with the short repetition time TR allow the measurement time of the coil sensitivities to be shortened to <100 ms per slice.

In a sensitivity measurement of a slice SL, each k-space line of this slice SL is acquired twice, and in fact once with the uniformly exposing volume coil 4 and once with the local coil 5 (which has a strong signal). A simultaneous acquisition of the signal with the volume coil 4 and the local coils 5 is not possible, in general, since the coils 4, 5 must be detuned from one another. Therefore the repeated measurement of a specific k-space line preferably takes place immediately after the first measurement, thus before other k-space lines are measured. This minimizes differences as a result of the travel and/or patient movement and/or physiological movement, such that the change in the received signal can be ascribed in good approximation to the different exposure of the receiver coils.

A very small flip angle (≈5°) is also used for the gradient echo sequence in order to avoid a long-lasting interference of the magnetization due to the measurement of the coil sensitivities. Normally different position-dependent surface coils are used to acquire the anatomical data for different slices. The same set of surface coils as is used during the anatomical measurement is thereby used to measure the coil sensitivity of a defined slice.

As explained above, the implemented scheme for interleaved acquisitions of coil sensitivities and imaging data is dependent on the imaging sequence that is used. The goal of the scheme in all methods is to keep the mutual influencing of the two measurements (due to saturation, interruption of a dynamic steady state etc., for example) as small as possible.

Figure 2:
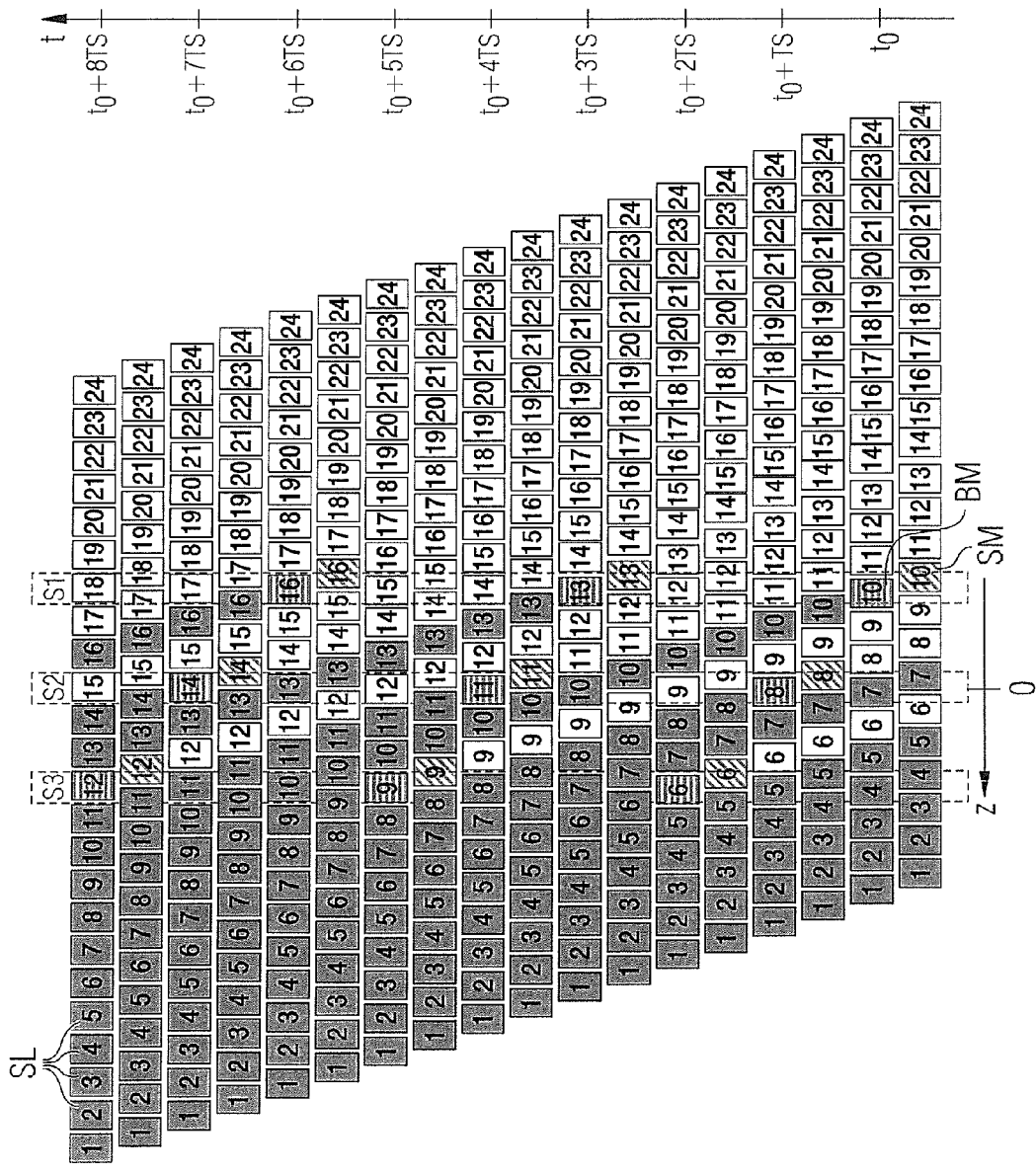
FIG. 2 is a schematic representation of the implementation of a magnetic resonance measurement according to the invention according to a first embodiment variant.

A first method is explained using FIG. 2.

This method in particular suggests itself given imaging sequences with short repetition time TR, such as TrueFISP ("True fast imaging with steady state precession") or proton density-weighted FLASH ("Fast Low Angle Shot") sequences. In these sequences it is possible to continuously (successively) acquire the data of a single slice in the center of the magnet, during which the examination subject is moved with constant velocity $$V_{table} = \frac{d}{N_{PE} TR} \qquad (1a)$$

$$V_{table} = \frac{d}{N_r TR} \quad (1b)$$

in the scanner 3. As is typical, the repetition time TR designates the time between two successive excitations of a slice, and $N_{PE}$ designates the number of phase coding steps per slice in a Cartesian acquisition technique or, respectively, $N_r$ designates the number of radial spokes per slice in a radial acquisition technique. d is the interval between adjacent slices.

Moreover, this method is particularly suitable for sequences in which the slice data are likewise acquired successively, meaning that the data of a first slice SL are acquired completely before the data acquisition of an additional slice SL is begin, wherein the data of anatomically adjacent slices are, however, preferably not acquired in temporal succession to reduce the crosstalk between the slices. Numbering among these sequences are, for example, single shot sequences such as echoplanar imaging (EPI) or half-Fourier single shot turbo spin echo (HASTE) sequences in which all k-space lines of an image are read out after a single radio-frequency excitation pulse, as well as sequences with short repetition time TR (such as TurboFLASH) in which a selective preparation pulse is used.

In the following the time interval TS designates the time separation between the anatomical measurement of two slices that are measured in immediate succession. This time is frequently already longer than the acquisition time TA1 per anatomical slice in order to not exceed a predetermined maximum energy radiation per unit of time (in HASTE, TrueFISP) or the duty cycle of a gradient amplifier (in a diffusion-weighted EPI measurement), for example. In the event that this is not the case, or in the event that the difference time TS−TA1 is shorter than a time TA2 that is required for acquisition of the coil sensitivities of a slice, TS is accordingly to be extended so that TS≥TA1+TA2 is valid.

This extension normally requires an additional adaptation of the table speed. The above Equations (1a) and (1b) are accordingly to be replaced with the Equations $$V_{table} = \frac{d}{TS} \geq \frac{d}{TA2 + N_{PE} TR} \quad (2a)$$

$$V_{table} = \frac{d}{TS} \geq \frac{d}{TA2 + N_r TR} \quad (2b)$$

In single shot sequences such as HASTE or EPI, the repetition time TR is also undefined. The following formula for the table speed also applies to single shot sequences:

$$V_{table} = \frac{d}{TS} \geq \frac{d}{TA2 + TA1} \quad (2c)$$

With TS≥TA1+TA2, a pause results between the acquisition of the successive slices that is long enough in order to acquire the coil sensitivities of a slice. In a preferred embodiment, the coil sensitivity of the next slice to be measured is thereby acquired.

Since the excitation angle of the gradient echo sequence used to measure the coil sensitivities is small, the interference of the magnetization and therefore the degradation of the following anatomical measurement are slight.

If TS≥TA1+TA2 is valid, the pause TP=TS−(TA1+TA2) that is thereby provided is preferably inserted between the sensitivity measurement and the associated imaging measurement of the slice. The relaxation of the magnetization during the pause leads to a further reduction of the influence.

An interleaved acquisition of coil sensitivity data and anatomical data takes place concretely in the method shown in FIG. 2 within the scope of a CT Continuous Table move) single shot HASTE sequence. The starting point is an acquisition scheme for anatomical data that is known from DE 10 2009 021 242. By using such an acquisition scheme, the contrast variations and signal losses that are possibly linked with a crosstalk of RF pulses (preparation pulses, excitation pulses, refocusing pulses) can be minimized with a simultaneous, optimally similar acquisition of different slices.

The horizontal z-axis in FIG. 2 shows the table feed in direction R. The shown zero point of the z-axis is located in the isocenter of the magnet of the scanner. The time t is shown on the vertical axis. The examination region (the measurement volume, for example) here is divided into 24 slices SL with equidistant spacing, for example. These slices SL are numbered according to the order in which they are driven in the direction R of the table feed into the active volume in the center of the magnet. The anatomical data are measured at three different measurement positions S1, S2, S3 within the magnetic resonance scanner 3 (meaning that the parameter c in the method described in DE 10 2009 021 242 is equal to 3).

In FIG. 2, already measured slices SL have a grey background and slices SL that have not yet been measured are not shown filled in. A slice SL in which the imaging measurement BM is directly taking place at the shown point in time has a background of horizontal stripes. A slice SL whose coil sensitivities are presently being measured—i.e. at which the coil sensitivity measurement SM is taking place—has a background of angled lines. At the point in time $t_0$ (singled out at random), the slices SL with the numbers 1 through 5 and 7 have already been completely measured and the imaging measurement BM is presently taking place for slice Nr. 10 at the measurement position $S_1$ within the magnetic resonance scanner 3. The remaining slices SL have not yet been measured at this point in time. One time interval TS later, at the time $t_0$+TS, the imaging measurement BM of slice Nr. 8 takes place at the measurement position S2; another time interval TS later, at the time $t_0$+2TS, the imaging measurement BM of slice Nr. 6 takes place at the measurement position S3. Another time interval TS later, the acquisition scheme repeats with the imaging measurement BM of slice Nr. 13 at the measurement position S1. The coil sensitivities for the next slice SL to be measured are respectively acquired in the time intervals TS between the measurement of two slices SL.

The coil sensitivity measurement SM of slice Nr. 10 takes place at the point in time $t_0$−TS+TA1+TD. TD is a delay period with 0≤TD≤TP for the preceding imaging measurement of a different slice (not drawn), and TP is the pause time TP=TS−(TA1+TA2) introduced above. If this pause time TP is truly greater than zero, the selection of the delay period TD thus allows an optimization between a maximum relaxation time of the magnetization after the measurement of the coil sensitivities (TD=0) and optimally unchanged measurement conditions at the time of the measurement of the coil sensitivities and at the time of the measurement of the anatomical data (TD=TP). Given a concrete implementation of the acquisition scheme shown in FIG. 2 for a CT single shot HASTE sequence, no signal loss in the anatomical images as a result of the preceding coil sensitivity measurement was observed with the values TS=1000 ms, TA1~600 ms, TA2~90 ms and TD=0.

As explained above, there are imaging sequences with longer repetition times TR from 70 ms up to multiple seconds, such as T1-weighted FLASH techniques or multi-shot turbo spin echo sequences (TSE), for example. In such sequences the successive acquisition of the slices in the center of the magnet can be inefficient since the long repetition time TR given a typical (in magnetic resonance tomography) slice interval of d=3 to 8 mm would lead to quite a slow table velocity according to Equations (1a), (1b) or, respectively, (2a) and (2b).

Therefore, in such methods an interleaved acquisition technique is advantageously worked with in which data of other slices are acquired between the successive excitations of a slice. Between two excitations of the same slice, the location of the excitation is thereby adapted to the table speed such that the same slice in the examination subject is respectively affected.

For example, the volume region in the examination subject that is to be imaged can be subdivided into multiple slice stacks of Ns slices. These slice stacks are successively measured. During the measurement of a slice stack, the measurement position thereby follows a fixed anatomical position within the examination subject traveling with the table. The velocity of the table is selected such that the travel path during the acquisition time of a slice stack is equal to the extent of a slice stack:

$$V_{table} = \frac{N_s d}{N_{PE} TR} \quad (3a)$$

$$V_{table} = \frac{N_s d}{N_r TR} \quad (3b)$$

The table speed—and therefore the efficiency—is thus increased by a factor $N_s$ in the interleaved acquisition technique relative to the successive technique.

The successive measurement of the slice stack that was just described can have the disadvantage that various slices of a slice stack are measured differently, which can lead to different distortions of the calculated images due to the nonlinearity of every real gradient system, for example. After the assembly of the images, discontinuities can thereby result (in particular at the stack boundaries) since anatomically adjacent slices that were associated with different slice stacks take up oppositional positions within the slice stack. This problem can be avoided by measuring the same k-space lines of different slices at the same location within the MR system, such that all slices are optimally measured similarly. This "Sliding Multislice" (SMS) technique is described by H.-P. Fautz and S. A. R. Kannengiesser in "Sliding Multislice (SMS): A New Technique for Minimum FOV Usage in Axial Continuously Moving-Table Acquisitions", Magnetic Resonance in Medicine 55, 363-370 (2006).

Figure 3:
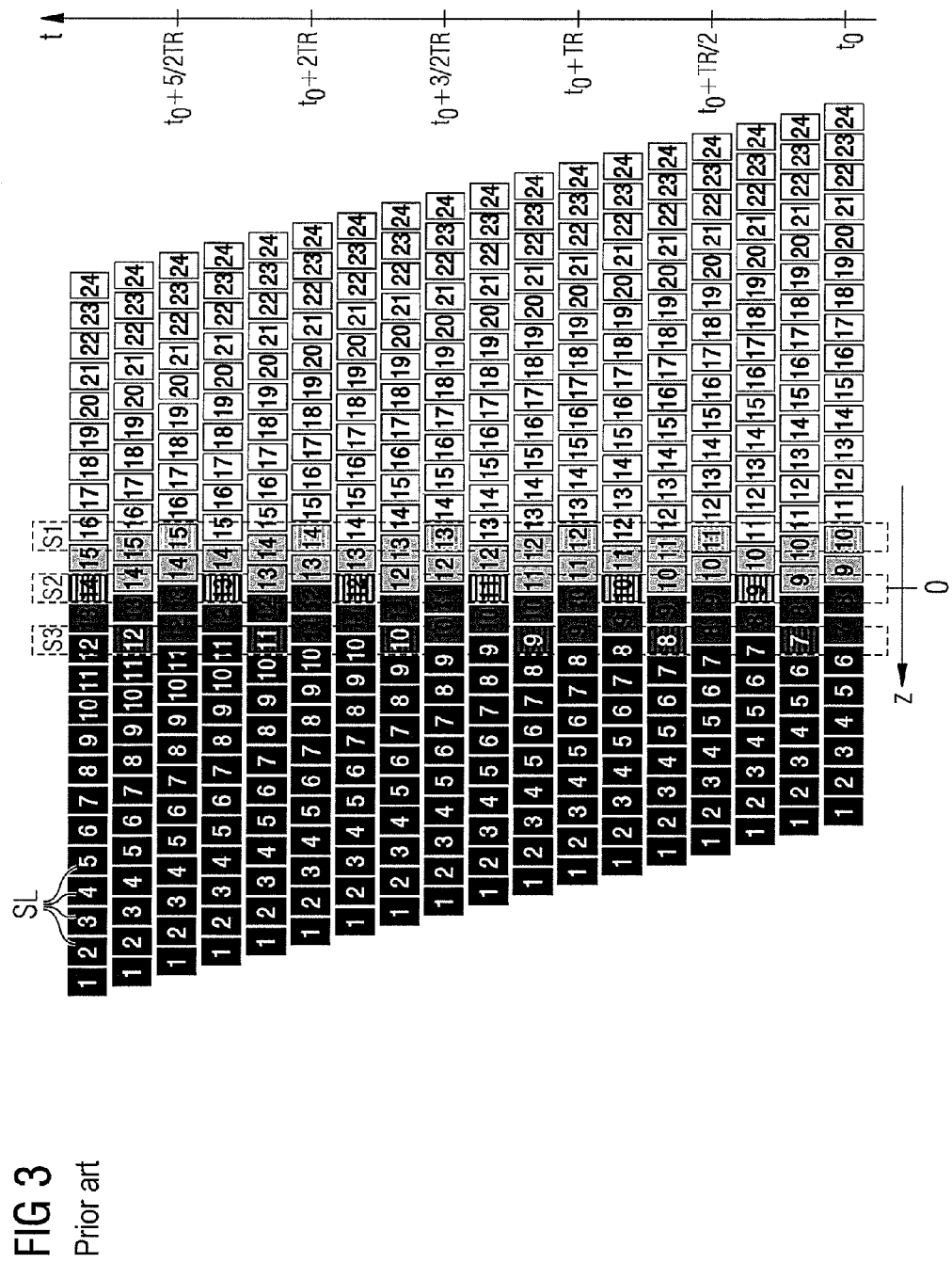
FIG. 3 is a schematic representation of the implementation of a magnetic resonance measurement according to one embodiment variant according to the prior art.

In FIG. 3 the acquisition of 24 slices in total using the previously described SMS technique of Fautz and Kannengiesser is shown as a simplified example. The horizontal z-axis again points in the direction of table feed, and the respective position of the slice stack is again plotted in the vertical direction as a function of the time t.

It is (with significant simplification) assumed that only three excitations are necessary for complete acquisition of a slice SL. According to the SMS scheme, corresponding k-space segments of different slices SL are acquired at the same measurement positions S1, S2, S3 within the scanner 3. A first segment after a first excitation at the measurement position S1, a second segment (after a second excitation) at the measurement position S2, and a third segment (after a third excitation) at the measurement position S3. The grey level of the background of a specific slice SL in FIG. 3 is a measure of the number of already measured segments (light grey: measurement of a k-space segment has already taken place; medium grey: measurement of two k-space segments; dark grey: complete measurement of all three k-space segments). Overall, data of six respective slices are acquired per TR interval.

The time resolution in the method according to FIG. 3 is ⅙ of the TR interval. Data of precisely one slice SL are thus acquired during a time interval TR/6 shown in the Figure. This slice SL respectively has a background horizontally striped in two grey levels. The table feed velocity $v_{sms}$ here is selected such that the table feed per TR interval amounts to precisely two slice intervals:

$$v_{sms} = 2 \cdot d/TR$$

and the number N of the slices that are excited and measured per TR interval is twice as large as the number E of the excitations per slice:

$$N = 2 \cdot E$$

This corresponds to Equation (1) or, respectively, (2) from the publication by Fautz and Kannengiesser that is cited above, with p=2, r=1, E=3, N=p·E=6, I=1 (The integer number p links the number E of the excitations per slice with the number N of the slices that are excited and measured per TR interval, and I is the number of generated images per slice; the factor r is initially 1. The case of r>1 is discussed further below.):

$$N = p \cdot E \quad (4a)$$

$$v_{sms} = p \cdot d/TR = N \cdot d/(E \cdot TR) \quad (4b)$$

The repetition time TR is thereby to be chosen to be at least so long that N slices (in the example of FIG. 3 N=6) can be excited and measured:

$$TR_{min} \geq p \cdot E \cdot TA_{exc} = N \cdot TA_{exc} \quad (5)$$

$TA_{exc}$ is the acquisition duration per excitation.

Figure 4:
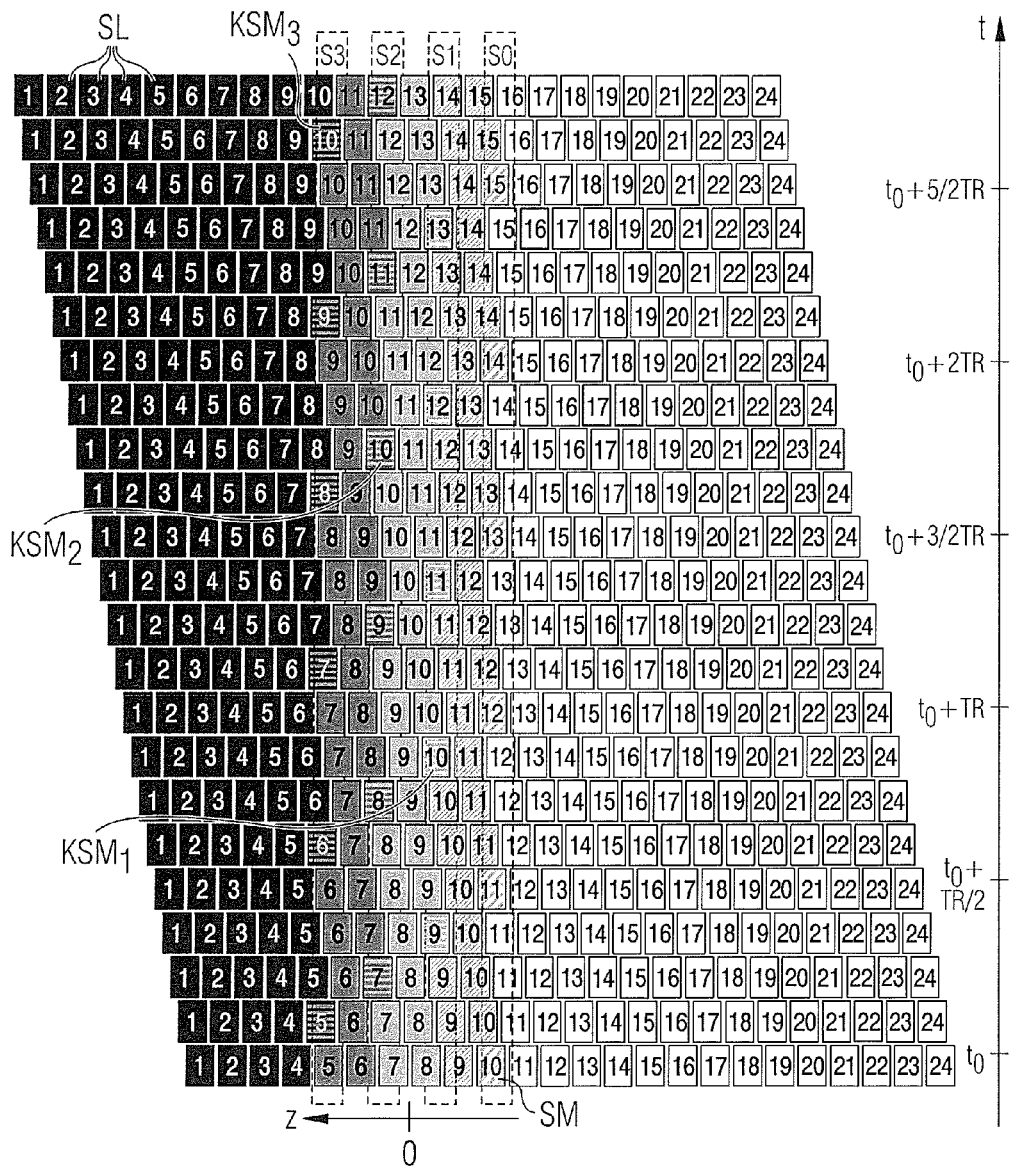
FIG. 4 is a schematic representation of the implementation of a magnetic resonance measurement according to a second embodiment variant in which the acquisition of the raw imaging data takes place analogous to the method according to FIG. 3.

An extension of the acquisition scheme according to FIG. 3 for the additional acquisition of the coil sensitivities is now shown using FIG. 4.

For a complete acquisition of the anatomical data of a slice SL, here three excitations are necessary again. The three k-space segments are respectively acquired in partial image data measurements $KSM_1$, $KSM_2$, $KSM_3$ when the slice SL is located at the measurement positions S1, S2, S3 within the scanner 3. In addition, there is now a fourth measurement position S0 (which is different than in the known method according to FIG. 3). If a slice SL is located at this location, the coil sensitivity measurement SM is implemented.

A slice SL whose coil sensitivities have already been measured but from which no anatomical data have been acquired has a background of transversal lines. If a coil sensitivity measurement SM of a slice is presently being implemented at an indicated time interval, the measured slice SL is likewise shown with transversal lines, but fewer of them. As soon as the first anatomical data of a slice SL are measured in a first partial measurement $KSM_1$, the background corresponds to that in FIG. 3.

The time resolution in the method according to FIG. 4 is ⅛ of a TR interval. A k-space segment of six different slices SL and coil sensitivities of two slices SL are respectively acquired in a TR interval. Equation (4b) for calculation of the table velocity $v_{sms,sens}$ furthermore applies here:

$$v_{sms,sens} = p \cdot d/TR. \quad (6)$$

However, the repetition time TR must be chosen to be at least so long that, in addition to the excitation and measurement of N=p·E=2·3 k-space segments here, the measurement of p=2 coil sensitivities can take place in a TR interval:

$$TR_{min,sens} \geq p \cdot E \cdot TA_{exc} + p \cdot TA2 \quad (7)$$

TA2 is again the time that is required in order to acquire the coil sensitivities of a slice SL.

It is noted that Equations (6) and (7) do not arise from Equation (2) of the aforementioned publication by Fautz and Kannengiesser, in which the coil sensitivities are simply interpreted as an additional image, for example (I=2).

Given a $T_2$-weighted TSE sequence, the acquisition time $TA_{exc}$ per excitation is normally of the same order of magnitude or longer than the acquisition time TA2 for the coil sensitivities. Conversely, $T_1$-weighted 2D sequences are frequently driven with a desired repetition time TR in a range between 70 and 500 ms. In this TR range, the successive single slice acquisition technique of the aforementioned first sequence type is not as efficient. For example, in a FLASH sequence the number of excitations is equal to the number of k-space lines to be measured ($N_{pe}$ in Equation (2a)) or k-space spokes ($N_r$ in Equation (2b)). In an SMS measurement the large number of excitations per image in this variant would thus lead to a large active FoV and a high table velocity. Therefore, in the aforementioned publication by Fautz and Kannengiesser a factor r≥1 is introduced that decouples the number N of slices that are measured per TR interval from the number E of excitations per image.

Equations (4a) and (4b) are therefore to be modified as follows:

$$N = p \cdot E / r \quad (4a')$$

$$v_{sms} = p \cdot d / (r \cdot TR) = N \cdot d / (E \cdot TR) \quad (4b')$$

Since here the time TA2 for the sensitivity data measurement is large in relationship to the excitation time $TA_{exc}$ for the acquisition of the image data, the modified SMS scheme described above should advantageously likewise be modified for the acquisition of the coil sensitivities in order to keep the method as efficient as possible. For example, for this purpose the number of k-space lines that are measured per coil sensitivity measurement can be selected to be equal to r/2, and then only a single coil sensitivity line can respectively be acquired per TR interval. Furthermore, each k-space line will thereby be acquired twice, namely once with the volume coil and once with the local coils.

In an exemplary embodiment that is not shown, the "in-place" method (not shown in Figures) that was already mentioned above is preferably used for such image data acquisition sequences as $T_1$-weighted FLASH sequences. The coil sensitivities are thereby acquired with the imaging sequence itself and calculated from the sufficiently scanned k-space center. However, the k-space center is thereby not only scanned densely but even doubly. For example, if $N_{sens}$ is the number of measured k-space lines of a coil sensitivity matrix, the $N_{sens}$ innermost k-space lines of the imaging k-space matrix can then be measured twice: once with the volume coil as a reception coil and once with the local coils as reception coils. $N_{sens}$ is normally small relative to $N_{PE}$, the number of phase coding steps per slice. The acquisition of the same one of the innermost line preferably takes place again in successive TR intervals, meaning that the readout of the k-space lines by the local coils and the volume coil takes place in alternation. Similarly, given a radial k-space trajectory it is sufficient to acquire only a small portion of the spokes twice, thus with volume coil and local coils. For example, if every n-th (n>>1) of the in total $N_r$ radial spokes is acquired twice per slice, and the $N_r$ spokes sufficiently occupy circular k-space with radius A, the $N_{sens}=N_r/n$ spokes that are measured twice already sufficiently acquire the circular, innermost region of this k-space with radius A/n. The low-resolution coil sensitivities can then be calculated from this circle with radius A/n.

Independent of the k-space trajectory, in this method the data acquired with the local coils are used twice, once for calculation of the coil sensitivities and once to calculate the anatomical images. In contrast to this, here the data acquired with the volume coil are used exclusively to calculate the coil sensitivities.

The number E of excitations per slice therefore increases by the number $N_{sens}$ of the k-space lines acquired by the volume coil according to $$E = N_{pe} + N_{sens}$$

insofar as $N_{pe}$ already takes into account the acquisition of the $N_{sens}$ innermost k-space lines with the local coils.

With the method described above, two additional low-resolution images that acquire the same slice twice—namely once via the local coils 5 and once via a volume coil 4—are obtained per anatomical image or, respectively, per axial slice SL of the measurement volume V.

Such low-resolution images for a slice are shown at the top in FIG. 5 as an example, wherein the low-resolution volume coil image $S_{BC}$ is shown on the right side and a low-resolution local coil image $S_{LC}$ is shown on the left side. This volume coil image $S_{BC}$ is an example of the low-resolution volume coil image data VSB calculated from the raw volume coil sensitivity data VSR, and the local coil image $S_{LC}$ is an example of the low resolution local coil image data LSB calculated from the raw local coil sensitivity data LSR in FIG. 1.

With these two images $S_{LC}$, $S_{BC}$, with the method known in the prior art a sensitivity image can be calculated which shows the spatially resolved local coil sensitivity in the image plane. The quotient $S_{LC}(p,q)/S_{BC}(p,q)$ is thereby a measure of the sensitivity of the local coils at the location that is associated with the pixel (p,q). Such a sensitivity image is generated for each anatomical image $I_{LC}(p,q)$ acquired with the imaging sequence and recorded with the local coils (this image $I_{LC}$ is an example of the image data BD in FIG. 1). A weighting of each pixel of the anatomical image $I_{LC}(p,q)$ with the pixel of an inverse sensitivity image $IM(p,q)=S_{BC}(p,q)/S_{LC}(p,q)$ largely corrects the intensity variations. In FIG. 5, the combination of the low-resolution volume coil image $S_{BC}$ and the low-resolution local coil image $S_{LC}$ into the inverse sensitivity image IM(p,q) is shown in Step I, and in Step II the weighting of the high-resolution anatomical image $I_{LC}(p,q)$ acquired with the local coils with this inverse sensitivity image IM(p,q) in order to obtain from this a normalized image $NI_{LC}(p,q)$ (this normalized image $NI_{LC}$ is an example of the normalized image data ND in FIG. 1). Since the quotient $S_{LC}(p,q)/S_{BC}(p,q)$ does not assume any reasonable values for background pixels that essentially contain only noise, these pixels (p,q) must be excluded in the normalization. For this conventional background correction methods can be executed on the low-resolution images $S_{LC}$, $S_{BC}$ or on the sensitivity image or the inverse sensitivity image IM.

The effect of the normalization according to the invention is clearly visible in FIG. 5 using a comparison of the original high-resolution anatomical image $I_{LC}$ (shown at the lower left) and the normalized image $NI_{LC}$ (shown to the right). The lower left image shows the decline of the greyscale values at the image center and their correction (lower right image) with the coil sensitivities acquired according to the invention. The image was acquired with a fat-saturated CT-FLASH sequence in a Siemens MAGNETOM Skyra 3T scanner. The low-resolution images shown at the top in FIG. 5 for calculation of the coil sensitivities were acquired during the same travel using a method according to the invention.

Aside from the normalization, the measured coil sensitivities or the measured, low-resolution data set can advantageously still be used for additional purposes.

For example, if multiple reception coils with different spatial sensitivity are available, parallel reconstruction techniques during the acquisition allow some phase encoding steps to be omitted and the missing data to be substituted with the aid of what are known as coil calibration data and the measured image data, and thereby allow ghosting artifacts as a result of the omitted lines to be avoided.

In some of the known reconstruction methods such as SENSE ("sensitivity encoding"), the coil sensitivities can thereby be directly used as coil calibration data.

The parallel reconstruction technique GRAPPA ("GeneRalized Autocalibrating Partially Parallel Acquisitions") calculates any missing k-space measurement value as a linear combination of the measured k-space points of all coils in a neighborhood of the missing k-space measurement value. The complex linear factors ("weights") required for this are calculated from a completely measured k-space data set by solving a linear equation system. The calculation of the coil sensitivities is not required for this. The low-resolution data set measured with the local coils can be used as a completely measured data set. The second low-resolution data set measured with the volume coil is not required in the known GRAPPA variants and consequently is used exclusively for image normalization.

Such a method can be implemented for a single shot CT-HASTE sequence. The parallel reconstruction technique then serves primarily to shorten the echo train at a given resolution and to increase the transit speed along the phase coding direction in k-space. The shortened echo time reduces the radio-frequency exposure of the patient, for example the specific absorption rate (thus the energy radiation per unit of time, per kg of the body weight of the patient; abbreviated as SAR); the increased k-space speed reduces smearing artifacts due to the unavoidable $T_2$ decay along the echo train.

It is noted that, given the use of calibration data measured with a proton density-weighted gradient echo sequence for the parallel reconstruction, at a given nominal acceleration factor the shortening of the echo train is greater and the average k-space transit speed is higher than in comparison to the "in-place" calibration typically used in connection with GRAPPA. The SAR exposure of the patient is accordingly lower and the smearing artifacts are smaller.

As mentioned above, the data acquired by the local coils are initially largely processed individual in their own separate acquisition channel and are subsequently combined into a single image (exceptions are, for example, parallel reconstruction techniques or combinations of the data into new channels, what are known as "virtual channels"). The sum-of-squares method cited above is frequently used in the combination. $I_j(p,q)$ designates the image that is acquired with the j-th channel ($1 \leq j \leq Nc$), therefore the combined image $I_{SOS}(p, q)$ then results as:

$$I_{SOS}(p, q) = \sqrt{\sum_{j=1}^{N_c} |I_j(p, q)|^2}$$

As an alternative to the sum of squares, the "adaptive combine" algorithm can also be used that calculates a complex combined image with the aid of an eigenvalue decomposition in a neighborhood of the image point (see for example David O. Walsh et. al., "Adaptive Reconstruction of Phased Array MR Imagery", Magnetic Resonance in Medicine 43:682-690 (2000)).

From the work "The NMR Phased Array" by P. B. Roemer et. al. in MRM16, 192-225 (1990) it is already known that—insofar as the coil sensitivities are known—an image with better signal-to-noise ratio can be calculated as follows:

$$I_{Roemer}(p, q) = \frac{\sum_{j=1}^{N_c} I_j(p, q) S_j^*(p, q)}{\sqrt{\sum_{j=1}^{N_c} |S_j(p, q)|^2}}$$

$S_j(p,q)$ designates the coil sensitivity of the j-th acquisition channel, and the superscript star designates a complex conjugation. The measured coil sensitivities can thus also or additionally be used for SNR-optimized channel combination.

The method according to the invention has a range of advantages:

In all embodiments of the method according to the invention, the coil sensitivities are first acquired in real time and second at adjacent positions within the magnetic resonance tomography with regard to the associated anatomical images. The real-time acquisition is not provided given a stationary measurement of the coil sensitivities or given the measurement of the coil sensitivities in an extra travel, for example. Via the real-time acquisition, differences between anatomical data and associated coil sensitivities—for example as a result of a different breath hold state or physiological processes—are avoided. Differences between coil sensitivities and imaging data as a result of imperfections of the magnetic resonance scanner (such as a nonlinearity of the gradient coils) are avoided via local acquisition.

Third, differences resulting during a travel as a result of different measurement conditions (different table velocities, for example) are avoided via the interleaved acquisition. Fourth, the method takes into account the different load conditions at different bed positions.

The method additionally allows the combined use of coils that are stationary relative to the magnetic resonance scanner and those that are driven through the system with the patient. A limitation to a coil group (either stationary relative to the magnetic resonance scanner or driven with the patient) that could result in a non-uniform illumination that could not be compensated via an image normalization can thus be avoided. Neither an additional stationary measurement to measure the coil sensitivities at one or more stations nor an additional travel is thereby necessary.

Given SAR-intensive sequences such as HASTE or TSE, the coil sensitivities can be acquired with a less SAR-extensive sequence technique (such as FLASH). The acquisition duration of such measurements is frequently determined not by the duration of the individual sequence modules but rather by the regulated energy radiation per unit of time and kg of body weight. If the coil sensitivities are acquired in this sequence family during the cooling pauses that are to be inserted anyway, this effectively leads to no or only a very slight measurement time extension.

It is beneficial to use the more efficient coil sensitivities measured once for image normalization, for parallel image reconstruction and/or to combine various local coils, instead of acquiring the coil sensitivities for the image normalization in a prescan, acquiring the coil calibration data for parallel image reconstruction "in-place", and implementing the coil combination with sub-optimal methods such as "sum of squares" or "adaptive combine". However, it is a requirement that the measured coil sensitivities for all three methods are of sufficient quality. These requirements are met by the method according to the invention.

Finally, it is noted again that the methods and designs described in detail in the preceding are exemplary embodiments, and that the basic principle can also be varied within wide ranges by one skilled in the art without leaving the scope of the invention insofar as it is provided by the Claims. Although the invention was described in the preceding using a magnetic resonance tomography system in the medical field, the invention is also usable in scientific and/or industrially utilized magnetic resonance tomography systems.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate magnetic resonance image data comprising:
   placing an examination subject on a movable table in a magnetic resonance data acquisition scanner comprising a plurality of local reception coils situated so as to move together with said patient on said movable table, each of said local reception coils having a coil sensitivity;
   operating said magnetic resonance data acquisition scanner to acquire raw data from multiple slices of a predetermined volume region of the examination subject in a plurality of imaging measurements with said raw data being received, in each imaging measurement, by at least a subset of said plurality of said local reception coils, while feeding the patient on the table through the magnetic resonance data acquisition scanner together with said plurality of local reception coils, said coil sensitivities of said local reception coils changing due to said feeding of the patient through the magnetic resonance data acquisition scanner together with said plurality of local reception coils;
   operating said magnetic resonance detection scanner to detect, during said feeding, coil sensitivity data, representing said changing coil sensitivities of at least said subset of said plurality of local reception coils, in respective sensitivity measurements interleaved with said imaging measurements of at least said multiple slices;
   in a processor, reconstructing image data for each of the slices based on the raw data; and
   in said processor, normalizing said image data based on the detected coil sensitivity data, representing the respective changing coil sensitivities of the local coils used to acquire said raw data in each subset respectively for each of said slices.

2. A method as claimed in claim 1 wherein said magnetic resonance data acquisition scanner also comprises a volume coil, and comprising, during acquisition of said raw imaging data, implementing sensitivity measurements to acquire raw imaging data for low-resolution local coil image data and raw imaging data for low-resolution volume coil imaging data, and determining the respective coil sensitivities from said raw imaging data for low-resolution local coil image data and said raw imaging data for low-resolution volume coil image data.

3. A method as claimed in claim 2 comprising entering said low-resolution local coil image data and said low-resolution volume coil image data respectively into alternating lines of k-space for each slice to acquire said raw imaging data for the low-resolution local coil image data and the raw imaging data for the low-resolution volume coil image data.

4. A method as claimed in claim 1 comprising implementing a sensitivity measurement to acquire said measured coil sensitivity data between acquisition of said raw imaging data for different slices among said plurality of slices.

5. A method as claimed in claim 4 comprising implementing a sensitivity measurement for a respective slice and acquiring the raw imaging data from that respective slice grouped together in time.

6. A method as claimed in claim 1 comprising acquiring said measured coil sensitivity data in a sensitivity measurement for a respective slice that takes place before acquisition of said raw imaging data from that respective slice.

7. A method as claimed in claim 1 comprising acquiring said raw imaging data for a respective slice by scanning segments of k-space for the respective slice in multiple partial data acquisitions, and implementing a sensitivity measurement to acquire said sensitivity data for the respective slice before acquisition of a first of said k-space segments or after acquisition of a last of said k-space segments.

8. A method as claimed in claim 1 comprising acquiring said raw imaging data for a respective slice by acquiring k-space segments at defined measurement positions in a measurement volume of the magnetic resonance data acquisition unit respectively in multiple partial measurements, and, for each measurement position, acquiring said sensitivity data in a sensitivity measurement associated therewith.

9. A method as claimed in claim 1 comprising determining said sensitivity data for a respective slice from a portion of the raw imaging data acquired for that respective slice.

10. A method as claimed in claim 1 comprising feeding said table in a feed direction through said magnetic resonance data acquisition scanner, and reading out said raw imaging data in a direction perpendicular to said feed direction.

11. A method as claimed in claim 1 comprising acquiring said sensitivity data in respective sensitivity measurements for respective slices by excitation of the respective slices with a small flip angle.

12. A method as claimed in claim 1 comprising, after each sensitivity measurement, waiting a defined minimum wait time before acquiring the raw imaging data in the imaging measurement for that respective slice.

13. A method as claimed in claim 1 comprising additionally using said measured coil sensitivity data in a parallel image reconstruction measurement.

14. A method as claimed in claim 1 comprising additionally using said measured coil sensitivity data in a complex combination of respective single coil images.

15. A magnetic resonance tomography system comprising:
   a magnetic resonance data acquisition scanner comprising a moveable table configured to support an examination subject thereon, and a plurality of local reception coils, each of said local reception coils having a coil sensitivity, and situated so as to move together with said patient on said movable table;
   a control computer configured to operate said magnetic resonance data acquisition scanner to acquire raw data from multiple slices of a predetermined volume region of the examination subject in a plurality of imaging measurements, with said raw data being received in each imaging measurement by at least a subset of said plurality of local reception coils while feeding the patient on the table through the magnetic resonance data acquisition scanner together with said plurality of local reception coils, said coil sensitivities of said local coils changing due to said feeding of the patient through the magnetic resonance data acquisition scanner together with said plurality of local reception coils;

said control computer being configured to operate said magnetic resonance data acquisition scanner to detect, during said feeding, coil sensitivity data, representing said changing coil sensitivities of at least said subset of said plurality of local reception coils, in respective sensitivity measurements interleaved with said imaging measurements of at least said multiple slices;

a processor configured to reconstruct image data for each of the slices based on the raw data; and said processor being configured to normalize said image data based on the detected coil sensitivity data, representing the respective changing coil sensitivities of the local coils used to acquire said raw data in each subset respectively for each of said slices.

16. A non-transitory, computer-readable data storage medium encoded with programming instructions, said data storage medium being loaded into a computerized control and evaluation system of a magnetic resonance system comprising a magnetic resonance data acquisition scanner comprising a moveable table configured to support an examination subject thereon, and a plurality of local reception coils, each having a coil sensitivity, and situated so as to move together with said patient on said movable table, said programming instructions causing said computerized control and evaluation system to:

operate said magnetic resonance data acquisition scanner to acquire raw data from multiple slices of a predetermined volume region of the examination subject in a plurality of imaging measurements, with said raw data being received in each imaging measurement by at least a subset of said plurality of local reception coils at while feeding the patient on the table through the magnetic resonance data acquisition scanner together with said plurality of local reception coils, said coil sensitivities of said local coils changing due to said feeding of the patient through the magnetic resonance data acquisition scanner together with said plurality of local reception coils;

detect, during said feeding, coil sensitivity data, representing said changing coil sensitivities of at least said subset of said plurality of local reception coils, in respective sensitivity measurements interleaved with said imaging measurements of at least said multiple slices;

reconstruct image data for each of the slices based on the raw data; and normalize said image data based on the detected coil sensitivity data, representing the respective changing coil sensitivities of the local coils used to acquire said raw data in each subset respectively for each of said slices.

* * * * *